US006915561B2

(12) United States Patent
Yokoyama et al.

(10) Patent No.: US 6,915,561 B2
(45) Date of Patent: Jul. 12, 2005

(54) ELECTRONIC COMPONENT MOUNTING APPARATUS

(75) Inventors: Dai Yokoyama, Yamanashi (JP); Hideaki Watanabe, Yamanashi (JP); Kiyoshi Imai, Wakayama (JP); Toshiyuki Koyama, Yamanashi (JP); Taira Ishii, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 372 days.

(21) Appl. No.: 10/074,892

(22) Filed: Feb. 13, 2002

(65) Prior Publication Data

US 2002/0108237 A1 Aug. 15, 2002

(30) Foreign Application Priority Data

Feb. 15, 2001 (JP) ..................................... P. 2001-038681

(51) Int. Cl.$^7$ ................................................ H05K 3/30
(52) U.S. Cl. ............................ 29/740; 29/739; 29/741; 29/832; 414/737; 414/751.1; 414/752.1; 901/40; 294/64.1
(58) Field of Search .......................... 29/739, 740, 741, 29/832; 414/737, 751.1, 752.1; 901/40; 294/64.1

(56) References Cited

U.S. PATENT DOCUMENTS

| | | | |
|---|---|---|---|
| RE32,538 E | * | 11/1987 | Hawkswell .................. 29/740 |
| 4,866,838 A | | 9/1989 | Porter |
| 5,783,915 A | * | 7/1998 | Shida et al. ................ 318/135 |
| 5,909,837 A | | 6/1999 | Safabakhsh et al. |
| 6,412,166 B1 | * | 7/2002 | Inaba et al. .................... 29/741 |

FOREIGN PATENT DOCUMENTS

| | | |
|---|---|---|
| CN | 1241834 A | 1/2000 |
| DE | 39 38 088 A1 | 5/1991 |
| GB | 2 349 017 A | 10/2000 |
| JP | 5-82998 | 4/1993 |

* cited by examiner

*Primary Examiner*—Rick Kiltae Chang
(74) *Attorney, Agent, or Firm*—Pearne & Gordon LLP

(57) ABSTRACT

This invention relates to an electronic component mounting apparatus. In the apparatus, a rotary body for changing the direction of a component mounting section is fixed to a hollow rotary shaft with a flange. The hollow rotary shaft is provided in a hollow motor and rotated integrally with the rotary body by driving of the hollow motor. A wire extending from an electric component, which is provided in the rotary body for changing the direction of the component mounting section, is arranged in the hollow rotary shaft of the hollow motor. An end of the wire is fixed to the rotary body, and the wire is arranged with looseness or into a spiral in the hollow rotary shaft. Further a lateral surface of inside the hollow rotary shaft and a surface of a coupling shaft are coated with protective materials.

11 Claims, 5 Drawing Sheets

ELECTRONIC COMPONENT MOUNTING APPARATUS

BACKGROUND OF THE INVENTION

1. Field of the Invention

The present invention relates to an electronic component mounting apparatus for mounting an electronic component on a substrate and, more particularly, to a rotary driver that forms a part of the electronic component mounting apparatus and a method for processing of wiring.

2. Description of the Related Art

A structure of a conventional electronic component mounting apparatus 100 will now be described with reference to FIG. 4.

A rotary body 1 sequentially mounts various electronic components in predetermined positions on a substrate in variable mounting directions. The rotary body 1 is connected to a driver 3 through a first joint 2 for driving and is structured such that the driver 3 rotates the rotary body 1 by a predetermined amount in a reciprocating manner. The driver 3 is fixed to a fixed structure (frame or the like), which is not shown.

A component mounting section 18 is provided on the bottom of the rotary body 1, and the component mounting section 18 is connected to a driver 19 through a coupling shaft 17, which is possible to slide in the vertical and rotating directions. The component mounting section 18 is structured such that the component mounting section 18 moves up and down by a predetermined amount independently of the rotary body 1 when an electronic component is mounted in a predetermined position on a substrate.

The first joint 2 for driving includes a driving disc 4 provided on a rotary shaft of the driver 3, a driven disc 5 provided on the coupling shaft 17, and a driving belt 6 wound around and stretched between the driving disc 4 and the driven disc 5.

A wire 8 is a wire for an electric component such as a sensor incorporated in the rotary body 1. The wire 8 is guided such that it extends along the exterior of a guide plate 9 formed like a disc and is fixed to an upper end of the rotary body 1 with a fixing component 10 at one end of the wire 8. The position in which the wire 8 is fixed is referred to as "fixing point A". The wire 8 is attached to a movable block 13 in an intermediate position of the same, and the mounting position is referred to as "intermediate support point B".

The movable block 13 is attached to a slide block 16. The slide block 16 is supported and guided by a rectilinearly movable guide section 14 and is structured to move on a linear path 15 toward and away from the rotary body 1. In other words, the slide block 16 is structured to make a reciprocating motion. An upper end of the movable block 13 is connected to the driver 3 through a second joint 20 for driving disposed along the rectilinearly movable guide section 14.

The second joint 20 for driving includes a driving disc 21 provided on a rotary shaft of the driver 3, a driven disc 22 provided on a rotary shaft of the main body of the apparatus, and a driving belt 23 wound around and stretched between the driving disc 21 and the driven disc 22.

The movable block 13 is connected with the driving belt 23. Therefore the rotary body 1 is rotated through the first joint 2 for driving, and the movable block 13 is moved on the linear path 15 in synchronism with the rotation of the rotary body 1 through the driving belt 23 that forms a part of the second joint 20 for driving, when the driver 3 is operated.

The other end of the wire 8 is fixed to a fixing block 27 on the main body of the apparatus, and the fixing position is referred to as "fixing point C".

The wire 8 is formed into a straight line between the fixing point A to the intermediate support point B, which is referred to as "straight section 30". Further, the wire 8 is formed into a spiral, which can expand and contract, between the intermediate support point B and the other fixing point C, which is referred to as "coil section 31". Therefore, when the movable block 13 moves on the linear path 15, the amount of a change in the distance from the intermediate support point B to the other fixing point C as a result of the movement of the intermediate support point B can be absorbed by the coil section 31. Moreover, the wire 8 has another straight section located beyond the fixing point C.

Nevertheless, the conventional electronic component mounting apparatus has the following problems. The speed of the driver 3 may be increased to reduce the cycle time of the electronic component mounting apparatus or, in other words, to increase the speed of rotation in order to reduce the time required for the rotary body 1 to make a rotary motion to change the mounting direction. In this case, however, the life of the belt is significantly reduced because there is an increase in the tensile force acting on the driving belt 6 wound and stretched as described above.

Further, the driving belt 6 is wound around stretched between the driving disc 4 and driven disc 5, a slip or tooth miss-engagement can occur because of increasing in forces acting on contact areas between the driving disc 4 and driving belt 6, and between the driven disc 5 and driving belt 6.

Furthermore, residual vibrations increase when the rotary body 1 stops because of an increase in the acceleration or deceleration speed of the rotation. The residual vibrations have resulted in various problems including a reduction in the positional accuracy of component mounting.

Referring to the wire 8 of the electric product included in the rotary body 1, it has a structure in which the amount of a change in the distance from the intermediate support point B to the fixing point C, which is attributable to the movement of the intermediate support point B during the rotation of the rotary body 1, is absorbed by the coil section 31 (the curled section). However, when the rotating speed of the rotary body 1 is increased, a load applied to the wire 8 increases in the vicinity of the wire fixing portions at the intermediate support point B and the fixing point C. The reason the load increases is that a speed of expansion and contraction of the coil section 31 also increases, which is caused by a high-speed moving of the intermediate support point B according to the increasing of the rotating speed.

Since the vibration and the speed of expansion and contraction of the coil section 31 increase, circles of the coil contact each other with a greater force when the coil section 31 expands and contracts, which has resulted in a problem in that the life of the wire 8 is reduced.

Further, the joint 2 for driving must be provided in addition to the driver 3 in order to rotate the rotary body 1, and a wire-processing unit must be provided in order to process the wire 8. This has resulted in increases in the size of the facility and the number of components, and such increases have led to a cost increase.

SUMMARY OF THE INVENTION

To solve the above problems, the present invention provides an electronic component mounting apparatus in which the rotating time of the rotary body during mounting of an electronic component can be reduced and the life of a wire can be improved and which can be provided with a simple structure, at a low cost and in a small size.

The above-described object of the invention is achieved in structures as described below.

A first aspect of the invention provides an electronic component mounting apparatus including a rotary body, a component mounting section which positions an electronic component on a substrate in a predetermined direction through rotation of the rotary body and which is driven in the axial direction of the rotary body to mount the electronic component, and a driver and a coupling shaft for driving said component mounting section in the axial direction of said rotary body. The electronic component mounting apparatus further includes a hollow motor having a hollow rotary shaft formed with a hollow interior as a rotor disposed in the axial direction of the rotary body, wherein the hollow rotary shaft and the rotary body are coupled with each other, the hollow rotary shaft and the rotary body are rotated integrally with each other by driving the hollow motor, and the direction in which the electronic component is mounted by the component mounting section is changed by the above process.

A second aspect of the invention provides an electronic component mounting apparatus including a rotary body, a component mounting section which positions an electronic component on a substrate in a predetermined direction through rotation of the rotary body and which is driven in the axial direction of the rotary body to mount the electronic component, a driver and a coupling shaft for driving the component mounting section in the axial direction of the rotary body, and an electronic component provided in the rotary body. The electronic component mounting apparatus further includes a hollow motor having a hollow rotary shaft formed with a hollow interior as a rotor disposed in the axial direction of the rotary body, wherein the hollow rotary shaft and the rotary body are coupled with each other, the hollow rotary shaft and the rotary body are rotated integrally with each other by driving the hollow motor, and a wire extending from the electronic component is extended in a direction of the axis of the hollow rotary shaft and pulled out from the hollow rotary shaft with an end of the wire substantially fixed to the rotary body.

A third aspect of the invention provides the electronic component mounting apparatus according to the second aspect of the invention, wherein the wire is loosely arranged in the hollow rotary shaft.

A forth aspect of the invention provides the electronic component mounting apparatus according to the second aspect of the invention, wherein the wire is formed into a spiral and arranged in the hollow rotary shaft.

A fifth aspect of the invention provides the electronic component mounting apparatus according to the second aspect of the invention, wherein protective materials are provided on an inner surface of the hollow rotary shaft and a surface of the coupling shaft.

In the electronic component mounting apparatus according to the first aspect of the invention, the rotary body is rotated integrally with the hollow motor when the hollow motor is driven because the rotary body is fixed to the hollow rotary shaft as a rotor that forms a part of the hollow motor. Therefore, the electronic component mounting apparatus does not need any power transmission means having a complicated structure and a great number of parts, which makes it possible to reduce the rotating time, to simplify the structure, and to reduce the number of parts at the same time.

In the electronic component mounting apparatus according to the second aspect of the invention, the wire is retained stably and a wire processing unit as seen in the conventional art is eliminated because the wire extending from a sensor or the like provided in the rotary body is arranged in the hollow rotary shaft that is the rotor of the hollow motor.

In the electronic component mounting apparatus according to the third or forth aspect of the invention, it is possible to eliminate problems such as a tensile force which otherwise acts on the connecting portion of the end of the wire because the amount of a movement of an end of the wire as a result of the rotation of the rotary body is absorbed by the looseness or the spiral coil section as described above.

In the electronic component mounting apparatus according to the above fifth aspect of the invention, it is possible to prevent damage to the jacket of the wire as a result of the rotation of the rotary body because an inner surface of the hollow rotary shaft and a surface of the coupling shaft are coated with protective materials.

DETAILED DESCRIPTION OF THE PREFERRED EMBODIMENTS

Figure 1:
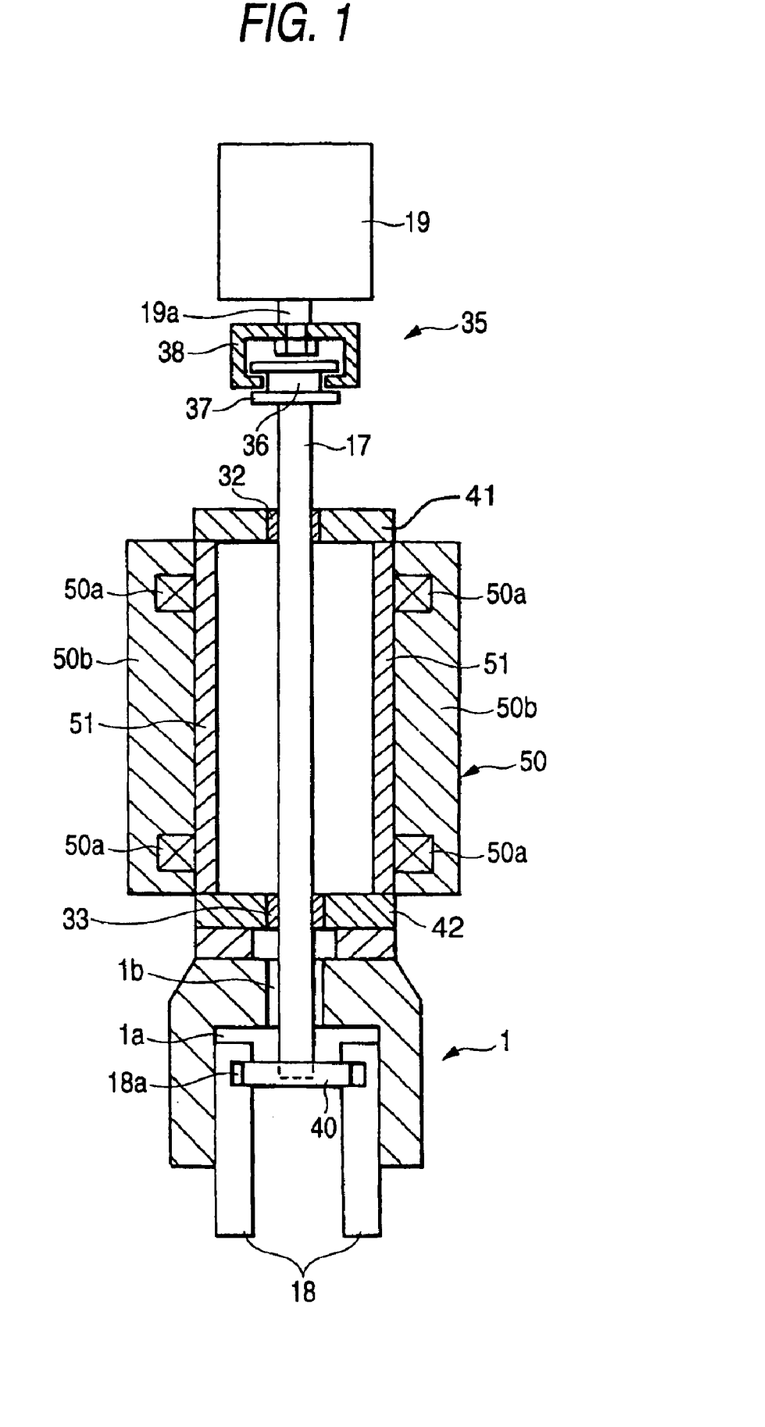
FIG. 1 is a sectional view showing a structure of a rotary body of an electronic component mounting apparatus, which is a first embodiment of the invention.

A first embodiment of an electronic component mounting apparatus according to the invention will now be described with reference to FIG. 1. FIG. 1 is a sectional view showing a structure of a rotary body, which forms a part of the electronic component mounting apparatus. The reference numbers used in the electronic component mounting apparatus 100 as an example of the conventional art and in the above description will be appropriately used in the description of the present embodiment.

A rotary body 1 shown in the lower part of FIG. 1 sequentially mounts electronic components in predetermined positions on a substrate in variable mounting directions similarly to the example of the conventional art. A hollow motor 50 is disposed above the same with a flange 42 interposed, and a driver 19 is further disposed above the same. The hollow motor 50 has a stator 50b around which a coil 50a is wound and a hollow rotary shaft 51 to serve as a rotor, and the hollow rotary body 51 and the rotary body 1 are connected through the flange 42. The rotary body 1 also makes a reciprocating rotary motion integrally with the hollow motor 50 when the hollow motor 50 is controlled to make a reciprocating rotary motion because the hollow motor 50 is fixed to a frame, which is not shown.

Figure 4:
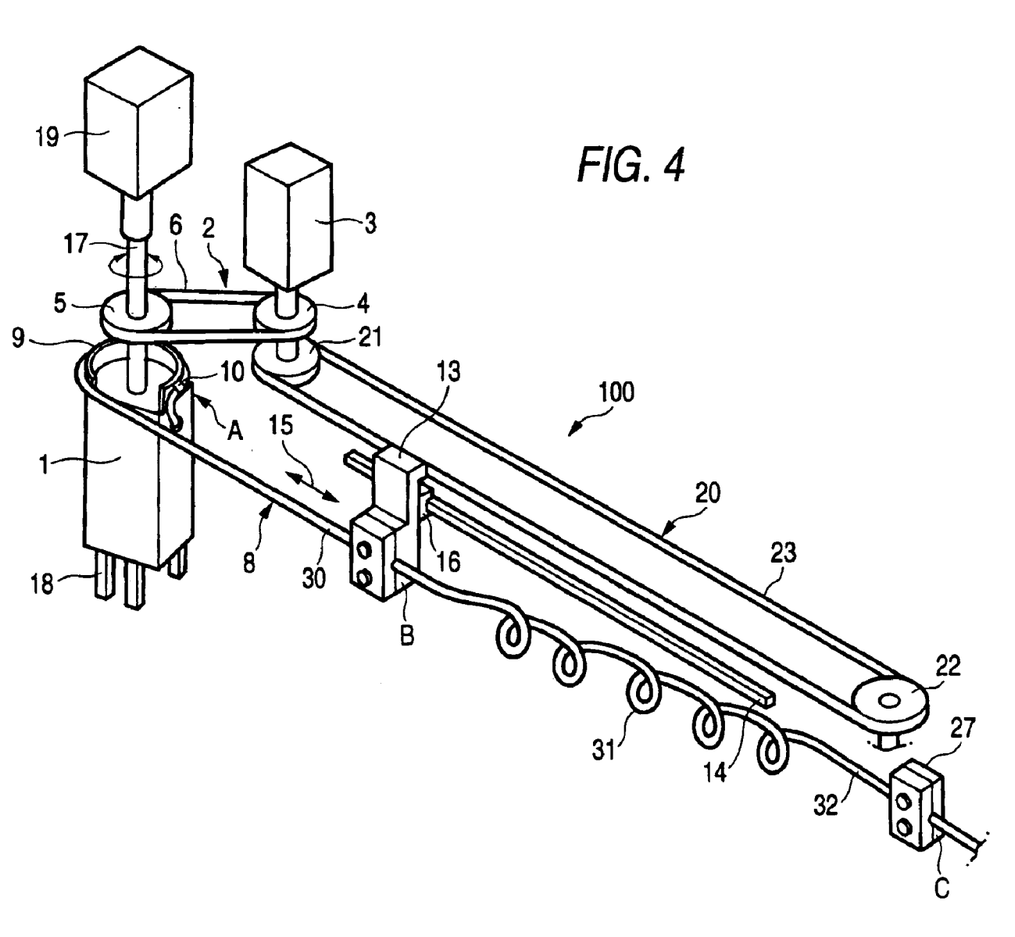
FIG. 4 is a perspective view showing a structure of a conventional electronic component mounting apparatus.

The rotary body 1 has an external structure like a square pole as shown in FIG. 4, and a hollow section 1a is formed inside the rotary body 1 as shown in FIG. 1. In the hollow section 1a, a component mounting section 18 is disposed. Since the hollow section 1a has a square cross section, the component mounting section 18 rotates integrally with the rotary body 1 when the latter rotates. However, the component mounting section 18 is not fixed to the rotary body 1 and is coupled with a coupling shaft 17 of the driver 19. Therefore, the component mounting section 18 is driven by the hollow motor 50 to make a reciprocating rotary motion integrally with the rotary body 1 and is driven by the driver 19 to move up and down independently of the rotary body 1.

The coupling shaft 17 extends through the flanges 41 and 42 provided on the upper and lower ends of the hollow rotary shaft 51, and the lower end of the coupling shaft 17 extends through a through hole 1b provided in the rotary body 1 and is fixed to a plate-like fitting member 40 coupled with the component mounting section 18. An outer circumferential edge of the fitting member 40 is fitted to a fitting groove 18a formed on an inner upper part of the component mounting section 18. Therefore, the component mounting section 18 as a whole is moved up and down independently of the rotary body 1 as the coupling shaft 17 moves up and down. Bushes 32 and 33 to serve as bearings are provided in the through holes provided in the flanges 41 and 42 to allow the coupling shaft 17 to move up and down smoothly.

The upper end of the coupling shaft 17 is coupled with the driver 19 through a coupling member 35. The coupling member 35 is provided to allow the coupling shaft 17 to move up and down and to allow the coupling shaft 17 to rotate smoothly. Specifically, the coupling member 35 includes a disc-shaped rotary plate 37 having a guide groove 36 formed around the same like a sash roller and a bearing member 38 whose ends are bent to enter the guide groove 36. The coupling shaft 17 is fixed to a central part of the rotary plate 37 and a cylinder rod 19a of the driver 19 is fixed to a central part of the bearing member 38 with a screw or the like.

Another example of the coupling member 35 is shown in FIG. 2(b). As shown in FIG. 2(b), a single row deep groove ball bearing may be used as the coupling member 35. In FIG. 2(b), the coupling member 35 includes a disc-shaped rotary member 37a having a guide groove 36a, balls 39, and bearing member 38a. The guide groove 36a is formed around the same like a sash roller. Ends of the bearing member 38a are bent to enter the guide groove 36a. Balls 39 or the like may be interposed between the guide groove 36a and the bearing member 38a in order to allow the rotary plate 37a to rotate smoothly.

The coupling shaft 17 is fixed to a central part of the rotary plate 37a and a cylinder rod 19a of the driver 19 is fixed to a central part of the bearing member 38a with a screw or the like. The driver 19 is preferably an air cylinder or the like.

The operation of the above-described rotary body 1 will now be described.

When an electronic component is mounted on a substrate, which is not shown, in the state shown in FIG. 1, the coupling shaft 17 is driven through the coupling member 35 by driving the driver 19 in the vertical direction, and the component mounting section 18 is also moved in the vertical direction through the coupling member 40. Let us assume that the component mounting section 18 is now mounting a component on a substrate. The component mounting section 18 is lowered by a predetermined distance by driving the driver 19 to mount the electronic component in a predetermined position on the substrate. When the mounting is completed, the driver 19 is driven in the opposite direction to pull up the component mounting section 18 and to cause it to wait for the next component mounting.

When the mounting direction of an electronic component is to be changed, the hollow motor 50 is driven to rotate the hollow rotary shaft 51 by a predetermined amount. Since this rotary motion is transmitted to the rotary body 1 through the flange 42, the component mounting section 18 rotates integrally with the rotary body 1 to change the direction of the electronic component to be mounted. When the driver 19 is driven after this operation, the coupling shaft 17 moves downward in the same manner as described above to lower the component mounting section 18 to a predetermined position on the substrate which is not shown, thereby mounting the electronic component in a direction that is different from the initial direction.

In the above-described structure, since the hollow motor 50 is provided to allow the rotary body 1 to rotate, there is no need for a coupling for driving or the like as described in the example of the conventional art. Therefore, it is possible to simplify the structure of the component mounting apparatus as a whole and to reduce the rotating time of the rotary body 1.

In addition, the coupling shaft 18 for moving the component mounting section 18 up and down moves up and down independently of the rotation of the hollow motor 50 and the position change of the component mounting section 18 as a result of the action of the coupling members 35 and 40. Therefore, the component mounting section 18 can move up and down reliably even when the mounting direction of an electronic component is changed. As a result, it is possible to reduce the occurrence of defects of electronic components during mounting and to improve the quality of an electronic apparatus incorporating such a substrate consequently.

A second embodiment of the invention will now be described with reference to FIG. 2(a).

FIG. 2(a) is a sectional view showing a structure of a rotary body, which forms a part of an electronic component mounting apparatus. A major difference between the present embodiment and the above-described first embodiment is the fact that an electric component 7 such as a sensor is provided in a rotary body 1, and the difference relates to a wiring process on a wire 8 connected to the electric component 7. Therefore, members having the same functions as those in the first embodiment are indicated by like reference numbers to avoid repeated description.

In the present embodiment, an electric component 7 such as a sensor is disposed above a rotary body 1, and a wiring hole 44 is formed such that it extends from the position where the electronic component 8 is disposed through a flange 42 into a hollow rotary shaft 51. A flange 43 is provided above the hollow motor 50, and the flange 43 is pierced by a coupling shaft 17 and is formed with a wiring hole 45 to allow a wire 8 to extend through the wiring hole 45. Though, FIG. 2(a) shows the wiring holes 44 and 45 as having diameters greater than the diameter of the wire 8, it is only for convenience in illustration. Practically, the wiring holes 44 and 45 are formed such that substantially no gap is formed between the wiring holes 44 and 45 and the wire 8 because they also have the function of fixing the wire 8.

An inner surface of the hollow rotary shaft 51 and an outer surface of the coupling shaft 17 are coated with protective materials 52. For example, Teflon (trademark) may be coated as the protective materials 52. In this case, the inner surface of the rotary shaft 51 and the outer surface of the coupling shaft 17 may be coated with Teflon, which is about 0.5 mm in thickness.

Figure 2:
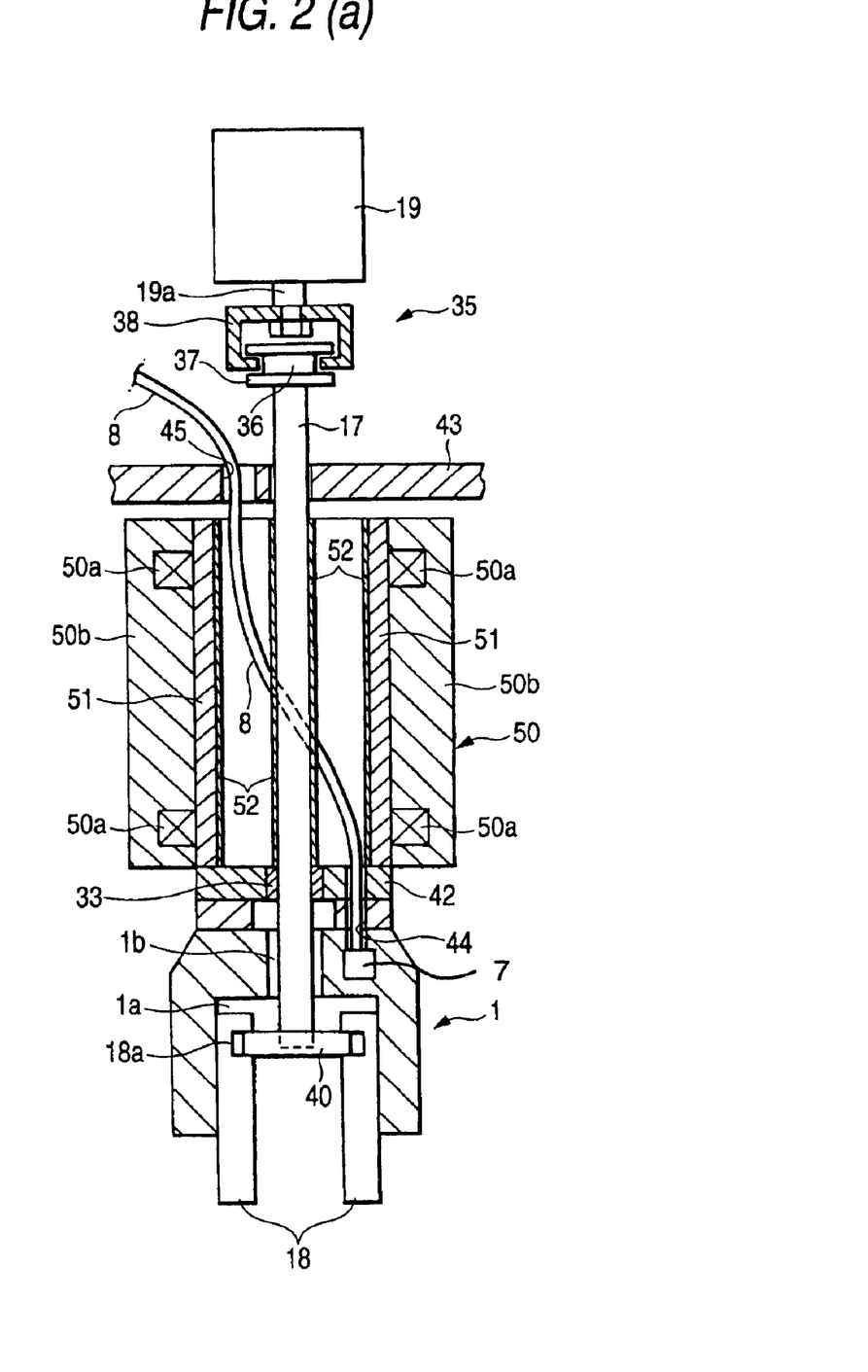
FIG. 2(a) is a sectional view showing a structure of a rotary body of an electronic component mounting apparatus, which is an example of a second embodiment of the invention.
FIG. 2(b) is a sectional view showing a detailed structure of rotary body of an electronic component mounting apparatus according to another example of the second embodiment of the invention and, regarding a structure of coupling member 35 in FIG. 2(b), it may be referred to another example of the first embodiment.

Besides the above material, it is possible to coat with bearings as the protective materials 52, as shown in FIG. 2(*b*).

Referring to the routing of the wire 8 in the above-described structure, the wire 8 connected to the electronic component 7 is pulled out from the through hole 44 into the hollow rotary shaft 51. Since the rotary shaft 51 has a drum-like structure, the wire is loosely stretched in the inner space of the same and is then pulled out from the wiring hole 45 to be wired to the electronic component mounting apparatus.

Referring now to the operation during the mounting of an electronic component, the electronic component mounting section 18 is driven for rotary and vertical motions in the same manner as described above to mount an electronic component, which is not shown on a substrate. When the hollow motor 50 is driven to change the mounting direction of the component, although the flange 42 and rotary body 1 are simultaneously rotated by a predetermined amount, no tensile force acts on the connecting portion between the wire 8 and the electronic component 7 such as a sensor as a load because the lower part of the wire 8 is fixed by the wiring hole 44.

Further, since the wire 8 is loose in the hollow rotary shaft 51, the amount of a change in the length of the wire 8 as a result of the rotation of the rotary body 1 is absorbed by the looseness. Moreover, since the upper part of the wire 8 is fixed by the wiring hole 45, the wire 8 is not pulled outside the wiring hole 45, which eliminates any influence on the position where it is connected to the apparatus.

When the driver 19 is driven to move the component mounting section up and down in the same manner as described above, the position of the electronic component 7 is kept unchanged, and the wire 8 is kept loose.

Because the wire 8 changes between loose and tensioned states as described above as the rotary body 1 rotates and reciprocates, the wire 8 contacts an inner lateral surface of the hollow rotary shaft 51 and contacts a surface of the coupling shaft 17. When the coupling shaft 17 is moved up and down with the rotary body 1 fixed, a surface of the coupling shaft 17 and the wire 8 can contact and scratch each other. However, since coating with the protective materials 52 are provided in the present embodiment as described above, the load applied to the jacket of the wire 8 is reduced, which makes it possible to prevent the jacket of the wire 8 from coming off.

A third embodiment of the invention will now be described with reference to FIG. 3.

Figure 3:
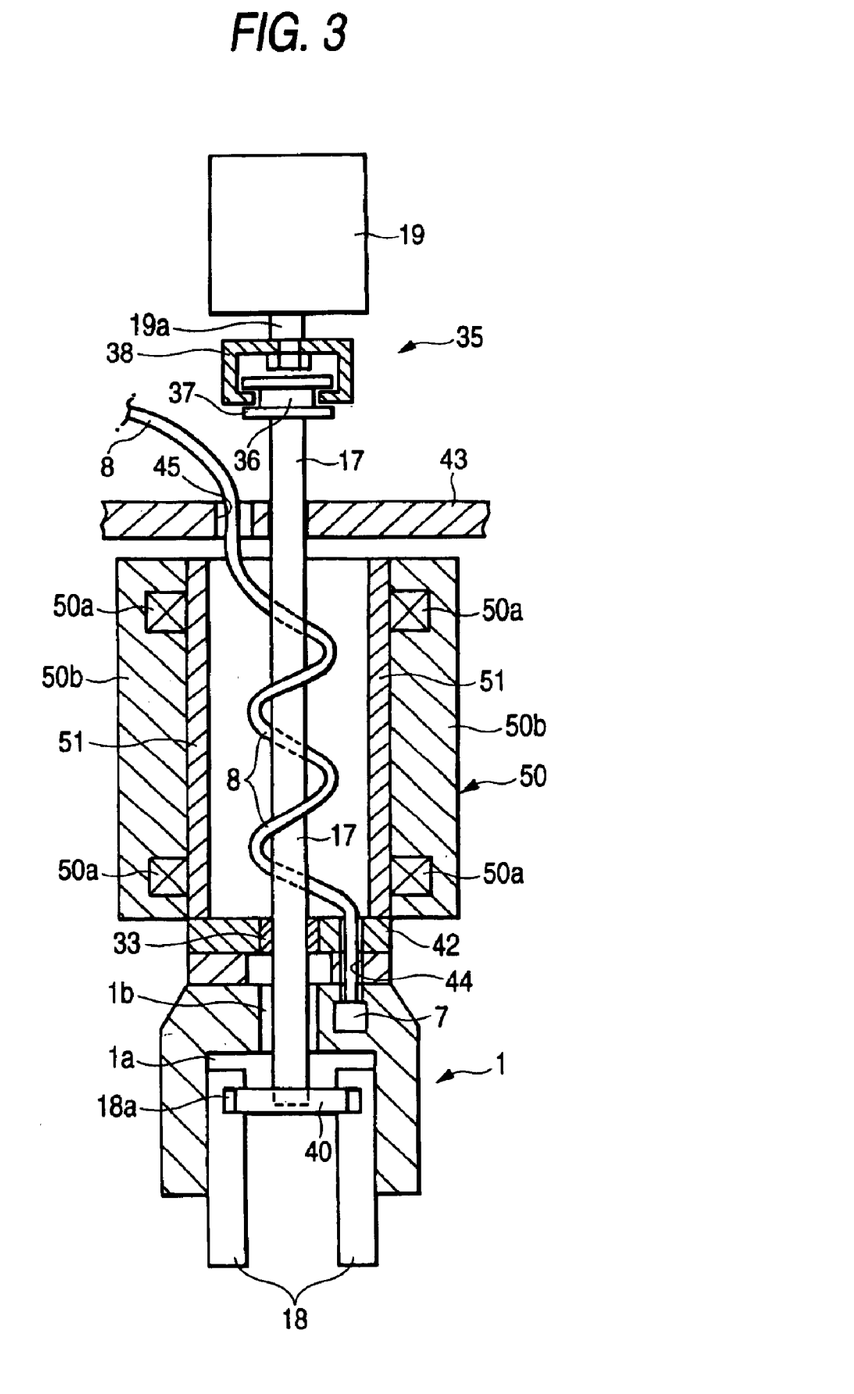
FIG. 3 is a sectional view showing a structure of a rotary body of an electronic component mounting apparatus, which is a first embodiment of the invention.

FIG. 3 is a sectional view showing a structure of a rotary body, which forms a part of an electronic component mounting apparatus. A major difference between the present embodiment and the above-described first embodiment is the fact that an electric component 7 such as a sensor is provided in a rotary body 1, and the difference relates to a wiring process on a wire 8 connected to the electric component 7. Therefore, members having the same functions as those in the above embodiments are indicated by like reference numbers to avoid repeated description.

In the present embodiment, an electric component 7 such as a sensor is disposed in the rotary body 1, and a flange 43 is provided also in the present embodiment. A wire 8 is wound around a coupling shaft 17 with some looseness, and the wound portion plays the role of the coil section 31 described in the example of the conventional art. The wire 8 is fixed in the same manner as described above by wiring holes 44 and 45.

When a hollow motor 50 is driven in the same manner as described above to rotate the rotary body 1 by a predetermined amount to change the mounting direction of a component, the a flange 42, the wiring through hole 44, and the electric component 7 rotate integrally with the rotary body 1. Although the lower part of the wire 8 rotated by a predetermined amount in the same manner as described above as a result of the rotation of the wiring through hole 44, the amount of the rotation of the wire 8 is absorbed by the coil section because the coil section of the wire 8 expands or contracts in the radial direction.

Coating with protective materials 52 similar to that in the second embodiment may be provided or may be omitted.

As described above, an electronic component mounting apparatus according to this invention does not need any power transmission means having a complicated structure and a great number of parts because the electronic component mounting apparatus has a structure in which a rotary body for changing the direction of a component mounting section is fixed to a hollow rotary shaft as a rotor that forms a part of a hollow motor to rotate the rotary body integrally with the hollow motor by driving the hollow motor. Therefore, it is possible to reduce the rotating time, to simplify the structure, and to reduce the number of parts at the same time.

Moreover, In an electronic component mounting apparatus according to this invention, a wire is retained with stability and any wire processing units as seen in the conventional art are eliminated because the electronic component mounting apparatus has a structure in which a wire extending from an electronic component such as a sensor provided on a rotary body for changing the direction of a component mounting section is extended in a hollow rotary shaft as a rotor of a hollow motor.

The amount of the movement can be absorbed by the coil section in a loose or spiral state, even when an end of the wire moves as a result of the rotation of the rotary body because the wire is provided in the hollow rotary shaft in a loose state or in a spiral form. This eliminates problems such as tensile force acting on a connecting portion of at the end of the wire as a load to improve the reliability of an electronic component mounting apparatus.

Additionally, damages to the jacket of the wire as a result of the rotation of the rotary body can be prevented by coating a lateral surface of the hollow rotary shaft and a surface of the coupling shaft with a protective material, which makes it possible to improve the reliability of an electronic component mounting apparatus.

What is claimed is:

1. An electronic component mounting apparatus comprising:

a rotary body a component mounting section rotatably provided with said rotary body, positioning an electronic component on a substrate in a predetermined direction, driven in an axial direction of said rotary body, and mounting the electronic component;

a driver for driving said component mounting section in the axial direction of said rotary body;

a coupling shaft for coupling said driver with said component mounting section; and a hollow motor disposed in the axial direction of said rotary body and including a hollow rotary shaft formed with a hollow interior as a rotor;

wherein said hollow rotary shaft is coupled with said rotary body, is driven and rotated integrally with said rotary body by said hollow motor, and changes the direction in which said electronic component is mounted by said component mounting section.

an electric component provided in said rotary body; and a wire extending from said electric component;

wherein an end of said wire extending from said electric component is substantially fixed to said rotary body with an end of said wire, and wherein said wire is arranged in said hollow rotary shaft and in an axial direction of said hollow rotary shaft, and pulled out from said hollow rotary shaft.

2. The electronic component mounting apparatus according to claim 1, wherein said wire is loosely in said hollow rotary shaft.

3. The electronic component mounting apparatus according to claim 1, wherein said wire is formed into a spiral and arranged in said hollow rotary shaft.

4. The electronic component mounting apparatus according to claim 1, wherein an inner surface of said hollow rotary shaft and a surface of said coupling shaft are coated with protective materials.

5. The electronic component mounting apparatus according to claim 2, wherein an inner surface of said hollow rotary shaft and a surface of said coupling shaft are coated with protective materials.

6. The electronic component mounting apparatus according to claim 3, wherein an inner surface of said hollow rotary shaft and a surface of said coupling shaft are coated with protective materials.

7. The electronic component mounting apparatus according to claim 1, wherein an upper end of said coupling shaft is coupled with said driver through a coupling member including a rotary plate, a guide groove formed around said rotary plate, and a bearing member whose ends are bent toward said guide groove.

8. The electronic component mounting apparatus according to claim 1, wherein lower end of said coupling shaft is coupled with said component mounting section through a fitting member formed into a plate, wherein said fitting member is fitted to a fitting groove formed on an inner upper part of said component mounting section and is fixed to said coupling shaft, wherein said component mounting section is provided in a hollow section of said rotary body and is movable in the axial direction of said rotary body.

9. The electronic component mounting apparatus according to claim 4, wherein said protective material is made of Teflon.

10. The electronic component mounting apparatus according to claim 4, wherein said protective material comprises a plurality of bearings.

11. The electronic component mounting apparatus according to claim 7, wherein said coupling member comprises balls inserted into a space between said guide said guide groove and said bearing member.

* * * * *

UNITED STATES PATENT AND TRADEMARK OFFICE
CERTIFICATE OF CORRECTION

PATENT NO. : 6,915,561 B2
DATED : July 12, 2005
INVENTOR(S) : Yokoyama et al.

It is certified that error appears in the above-identified patent and that said Letters Patent is hereby corrected as shown below:

Column 9,
Line 17, after "loosely", please insert -- arranged --.

Column 10,
Line 1, after "wherein", please insert -- a --.

Signed and Sealed this

Eighth Day of November, 2005

JON W. DUDAS
*Director of the United States Patent and Trademark Office*